United States Patent
Kim et al.

(10) Patent No.: US 7,482,649 B2
(45) Date of Patent: Jan. 27, 2009

(54) MULTI-BIT NONVOLATILE MEMORY DEVICES

(75) Inventors: Sung-Min Kim, Incheon (KR); Eun-Jung Yun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 312 days.

(21) Appl. No.: 11/335,390

(22) Filed: Jan. 19, 2006

(65) Prior Publication Data

US 2006/0157753 A1   Jul. 20, 2006

(30) Foreign Application Priority Data

Jan. 20, 2005   (KR)   ........................ 10-2005-0005403

(51) Int. Cl.
*H01L 29/74*   (2006.01)
*H01L 31/111*   (2006.01)
*H01L 27/108*   (2006.01)
*H01L 29/76*   (2006.01)
*H01L 31/119*   (2006.01)

(52) U.S. Cl. .................. 257/302; 257/328; 257/396; 257/136

(58) Field of Classification Search ............... 438/576, 438/257; 257/374, 510, 484, 302, 288, 328, 257/396, 135, 136, 242, 329
See application file for complete search history.

(56) References Cited

U.S. PATENT DOCUMENTS 6,309,929 B1 * 10/2001 Hsu et al. ................... 438/270

6,486,028 B1   11/2002 Chang et al. ................ 438/259
2006/0043617 A1 *   3/2006 Abbott ........................ 257/908

FOREIGN PATENT DOCUMENTS

| JP | 2004-014898 | 1/2004 |
| JP | 2004-088055 | 3/2004 |
| KR | 1020030081896 | 10/2003 |

OTHER PUBLICATIONS

Korean Intellectual Property Office Notice to Submit Response ; date of mailing Jul. 11, 2006.
English translation of Korean Intellectual Property Office Notice to Submit Response ; date of mailing Jul. 11, 2006.

\* cited by examiner

*Primary Examiner*—Chuong A. Luu
(74) *Attorney, Agent, or Firm*—Myers Bigel Sibley & Sajovec, P.A.

(57) ABSTRACT

Multi-bit nonvolatile memory devices and related methods of manufacturing the same are described. In some multi-bit nonvolatile memory devices, a semiconductor substrate has a recessed region defined therein. An insulating layer, which can include an ONO layer, is configured to store data within programming regions therein, and covers a sidewall and a lower surface of the recess region. A gate electrode is on the insulating layer in the recessed region. At least one pair of impurity regions are in the semiconductor substrate. The impurity regions adjoin a side surface of the insulating layer in the recess region and form a relative angle that is less than 120° therebetween with respect to a center of the gate electrode.

20 Claims, 22 Drawing Sheets

MULTI-BIT NONVOLATILE MEMORY DEVICES

CROSS-REFERENCE TO RELATED PATENT APPLICATION

This application claims priority under 35 U.S.C. § 119 of Korean Patent Application No. 10-2005-0005403, filed on Jan. 20, 2005, in the Korean Intellectual Property Office, the disclosure of which is incorporated herein in its entirety by reference.

FIELD OF THE INVENTION

The present invention relates to semiconductor devices and methods of manufacturing the same, and more particularly to nonvolatile memory devices that are configured to store multi-bit data and methods of manufacturing the same.

BACKGROUND OF THE INVENTION

In nonvolatile memory devices, multiple insulating layers such as tunnel insulating layers, charge trapping insulating layers and blocking insulating layers can be used to form a gate insulating layer. The charge trapping insulating layer generally includes silicon nitride which serves to trap charges. For example, charges can be injected into the charge trapping insulating layer by Fouler-Nordheim tunneling or hot carrier injection to form a stored logical value in a nonvolatile memory device. The stored charge is erased by discharging electrons from the charge trapping insulating layer or by injecting holes into the charge trapping insulating layer.

A multi-bit (multiple bit value) memory device can have an increased storage capacity without physically enlarging the size of a unit cell relative to that of a single bit memory device. For example, a 2-bit nonvolatile memory device can be formed by storing a single bit on each side of the charge trapping insulating layer. A 2-bit nonvolatile memory device may also be formed by storing single bits on respective sidewalls of a trench region in a semiconductor substrate in an attempt to address possible short channel effects.

SUMMARY OF THE INVENTION

Embodiments of the present invention are directed to multi-bit nonvolatile memory devices that can store two or more bits in a unit cell and related methods of manufacturing the same.

In some embodiments of the present invention, a multi-bit nonvolatile memory device includes a semiconductor substrate in which a recessed region is defined. An insulating layer is configured to store data within programming regions therein, and it covers a sidewall and a lower surface of the recess region. A gate electrode is on the insulating layer in the recessed region. At least one pair of impurity regions are in the semiconductor substrate. The impurity regions adjoin a side surface of the insulating layer in the recess region and form a relative angle that is less than 120° therebetween with respect to a center of the gate electrode.

The insulating layer may include a first ONO layer. Data can be selectively stored in different programming regions of the insulating layer to represent multiple different bit values by application of voltage to different adjoining ones of the impurity regions. The relative angle between the impurity regions may be 90°.

The recess region may have a cylindrical shape, a polyhedral shape, or a cubic shape. Corner areas of a cubic shaped recess region can adjoin at least one pair of the impurity regions. The recess region between the at least one pair of impurity regions can have a linear profile.

The gate electrode can protrude away from an upper surface of the semiconductor substrate. An upper surface of the gate electrode can be aligned with an adjacent major upper surface of the semiconductor substrate.

The impurity regions can include a first pair of impurity regions formed on a same side of the gate electrode with the gate electrode partially disposed therebetween, and may further include a second pair of impurity regions on an opposite side of the gate electrode from the first pair of impurity regions. Each of the four impurity regions of the first and second pairs of impurity regions may be part of a different one of four transistors. Data may be selectively stored in different programming regions of the insulating layer to represent multiple different bit values by application of voltage to different adjoining ones of the four impurity regions of the first and second pairs of impurity regions.

The insulating layer may include a dielectric film of a nano-crystal material and/or a dielectric film material with a plurality of charge traps.

In some other embodiments of the present invention, a multi-bit nonvolatile memory device includes a semiconductor substrate in which a plurality of recess regions are defined. An insulating layer is configured to store data within programming regions therein, and the insulating layer covers sidewalls and lower surfaces of the plurality of recess regions. A pair of gate electrode arrays each include gate electrodes on the insulating layer in the plurality of recess regions. The gate electrodes of a first one of the pairs of gate electrode arrays are arranged along a first line and the gate electrodes of a second one of the pairs of gate electrode arrays are arranged along a second line that is substantially parallel to the first line. A plurality of impurity regions are in the semiconductor substrate, and are arranged in the same direction as the gate electrodes of the pair of gate electrode arrays and adjoin side surfaces of the insulating layer in the recess regions. A pair of word lines, one of word lines is electrically connected to gate electrodes of the first one of the pairs of gate electrode arrays and is not electrically connected to gate electrodes of the second one of the pairs of gate electrode arrays, and the other word line is electrically connected to gate electrodes of the second one of the pairs of gate electrode arrays and is not electrically connected to gate electrodes of the first one of the pairs of gate electrode arrays. The gate electrodes of the first one of the pairs of gate electrode arrays are spaced apart from the gate electrode of the second one of the pairs of gate electrode arrays by a predetermined distance.

The insulating layer may include an ONO layer. Data may be selectively stored in different programming regions of the ONO layer to represent multiple different bit values by application of voltage to different adjoining ones of the impurity regions.

The plurality of impurity regions may each adjoin opposite facing sides of a pair of gate electrodes one of which is in the first one of the pairs of gate electrode arrays and the other one of which is in the second one of the pairs of gate electrode arrays.

The plurality of impurity regions may include first impurity regions, second impurity regions, and a pair of bit lines. The first impurity regions may be arranged in the same direction as a first one of the pairs of gate electrode arrays and adjoin a same side of gate electrodes of the first one of the pairs of gate electrode arrays. The second impurity regions may be spaced apart from the first impurity regions by a predetermined distance, and arranged in the same direction as the gate electrodes of the first one of the gate electrode arrays, and adjoin an opposite side of the gate electrodes of the first gate electrode arrays from the first impurity regions. One of bit lines is electrically connected to gate electrodes of the first one of the pairs of gate electrode arrays and is not electrically connected to gate electrodes of the second one of the pairs of gate electrode arrays, and the other one of the bit lines is electrically connected to gate electrodes of the second one of the pairs of gate electrode arrays and is not electrically connected to gate electrodes of the first one of the pairs of gate electrode arrays.

In some other embodiments of the present invention, a method of manufacturing a multi-bit nonvolatile memory device includes forming a recess region in a semiconductor substrate. A first ONO layer is formed to cover a sidewall and a lower surface of the recess region. A gate electrode is formed on the first ONO layer in the recess region. At least one pair of impurity regions is formed in the semiconductor substrate adjoining a side surface of the first ONO layer in the recess region.

Formation of the recess region may include forming a mask insulating layer on an upper surface of the semiconductor substrate. A photoresist pattern may be formed on the mask insulating layer to define a location and an opening having a cylindrical shape through which the recess region will be formed. The mask insulating layer may be etched using the photoresist pattern to expose a portion of the semiconductor substrate in which the recess region will be formed. An upper portion of the semiconductor substrate may be etched using the etch mask insulating layer to form the recess region with a cylindrical shape.

Formation of the recess region may include forming a mask insulating layer on an upper surface of the semiconductor substrate. A photoresist pattern may be formed on the mask insulating layer to define a location and a defined shape of an opening through which the recess region will be formed. The mask insulating layer may be etched using the photoresist pattern to expose a portion of the semiconductor substrate in which the recess region will be formed. An upper portion of the semiconductor substrate may be etched using the etched mask insulating layer to form the recess region with a defined shape. The semiconductor substrate with the recess region may be wet etched using an etchant including TMAH to form a polyhedrally shaped recess region with corner areas. The polyhedrally shaped recess region may be cube-shaped. Corner areas of the recess region may adjoin the impurity regions. The polyhedrally shaped recess region between the impurity regions may have a linear profile.

A first mask insulating layer may be formed on an upper surface of the semiconductor substrate. The first mask insulating layer and an upper portion of the semiconductor substrate may be removed to form the recess region. A blanket of ONO material may be deposited on the sidewall and lower surface of the recess region. A gate electrode material layer may be deposited on the ONO material in the recess region. The gate electrode material may be planarized so that an upper surface thereof is aligned with an upper major surface of the first ONO material to form the gate electrode. A portion of the ONO material layer and the first mask insulating layer may be removed to expose the semiconductor substrate.

The impurity regions may include first impurity regions formed on one side of the gate electrode with the gate electrode partially disposed therebetween. Formation of the first impurity regions may include forming a second mask insulating layer on an upper surface of the semiconductor substrate where the gate electrode is formed. A second photoresist pattern may be formed on the second mask insulating layer. The second mask insulating layer may be etched using the second photoresist pattern as an etch mask to partially expose the upper surface the semiconductor substrate where the impurity regions will be formed. The exposed upper surface of the semiconductor substrate may be doped with an impurity to form the first impurity regions. When forming the first impurity region, a height of the gate electrode above the upper surface of the semiconductor substrate may be about the same as a distance between the gate electrodes.

The at least one pair of impurity regions may include a first pair of impurity regions and a second pair of impurity regions on an opposite side of the gate electrode from the first pair of impurity regions. The first and second pair of impurity regions may be simultaneously formed. A second mask insulating layer may be formed on the surface of the semiconductor substrate where the gate electrode is formed. The second mask insulating layer may be etched to partially expose the upper surface of the semiconductor substrate where the first impurity regions and the second impurity regions will be formed. The exposed upper surface of the semiconductor substrate may be doped with an impurity to simultaneously form the first and second pairs of impurity regions. When forming the first and second impurity regions, a height of the gate electrode above the upper surface of the semiconductor substrate may be about the same as a distance between the gate electrodes.

A blanket of a first ONO material may be deposited to cover the sidewall and lower surface of the recess region. A gate electrode material layer may be deposited on the first ONO material in the recess region. The gate electrode material may be planarized to expose the upper surface of the semiconductor substrate and form the gate electrode. The first pair of impurity regions may be formed on one side of the gate electrode and the gate electrode is partially disposed between the first pair of impurity regions. A first mask insulating layer pattern may be formed on the upper surface of the semiconductor substrate where the gate electrode is formed and that partially exposes the upper surface of the semiconductor substrate where the first pair of impurity regions will be formed. An impurity may be doped into the exposed upper surface of the semiconductor substrate using the first mask insulating layer pattern as an ion implanting mask to from the first pair of impurity regions. The second pair of impurity regions may be on an opposite side of the gate electrodes from the first pair of impurity regions.

BRIEF DESCRIPTION OF THE DRAWINGS

The above and other features and advantages of the present invention will become more apparent by describing in detail exemplary embodiments thereof with reference to the attached drawings in which:

FIGS. 2A through 6A are plan views of a region (a) of FIG. 1 illustrating a method of manufacturing the nonvolatile memory device according to the first embodiment of the present invention;

FIGS. 2B through 6B are sectional views along line I-I of the nonvolatile memory device of FIG. 1;

FIGS. 9A through 13A are plan views a unit cell (b) of FIG. 8 illustrating a method of manufacturing the nonvolatile memory device according to the second embodiment of the present invention;

FIGS. 9B through 13B are sectional views along line II-II of FIG. 8 of the nonvolatile memory device;

FIGS. 15A through 17A are plan views of the unit cell (a) of FIG. 1 illustrating a method of manufacturing the nonvolatile memory device according to a third embodiment of the present invention;

FIGS. 15B through 17B are sectional views of the nonvolatile memory device taken along line I-I of FIG. 1 illustrating the third embodiment of the present invention;

FIGS. 18A through 20A are plan views of the unit cell (b) of FIG. 8 illustrating a method of manufacturing the nonvolatile memory device according to a fourth embodiment of the present invention;

FIGS. 18B through 20B are sectional views of the nonvolatile memory device taken along line II-II of FIG. 8 for illustrating the fourth embodiment of the present invention.

DETAILED DESCRIPTION OF EMBODIMENTS OF THE INVENTION

Figure 1:
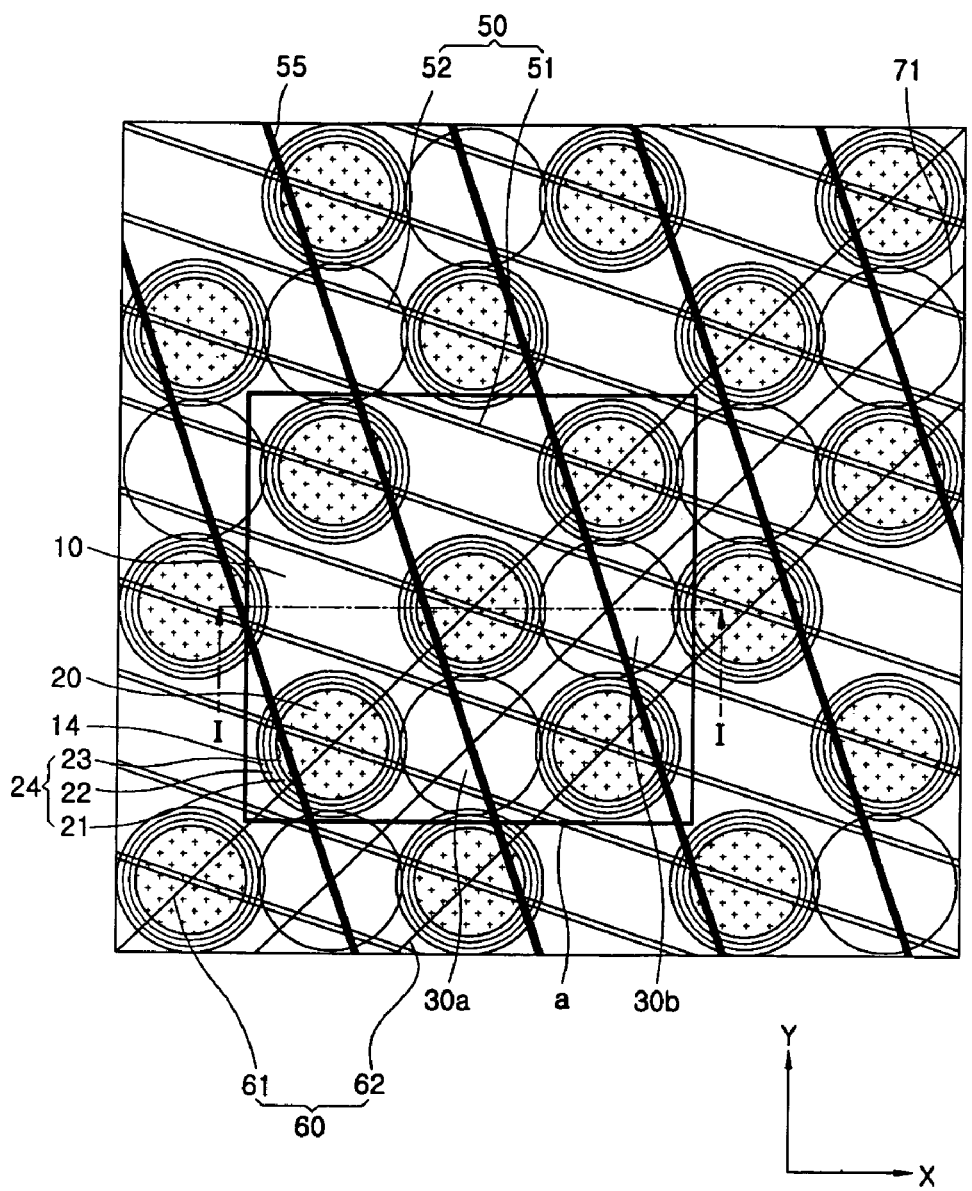
FIG. 1 is a plan view of a nonvolatile memory device according to a first embodiment of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Various embodiments of the present invention will now be described in accordance with configurations and arrangements of gate electrodes, impurity regions and recess regions. Although in these exemplary embodiments a first ONO layer 24, which is used as a gate insulating layer, is described as including an oxide layer 21, a nitride layer 22 and an oxide layer 23, it is to be understood that the invention is not limited to this exemplary gate insulating layer.

First Embodiment of the Present Invention

A nonvolatile memory device according to the first embodiment includes first impurity regions 30*a* and 30*b* adjoining a first gate electrode 20 that is buried in a first cylindrical recess region 14 and protrudes from a semiconductor substrate 10. A method of manufacturing the nonvolatile memory device is also provided.

FIG. 1 is a plan view showing the nonvolatile memory device according to the first embodiment, in which a region (a) denotes a unit cell. The region (a) is repeated on the same plane in the X-axis direction and the Y-axis direction. Some parts such as a spacer 28 (See FIGS. 5A and 5B) are not illustrated in FIG. 1.

Referring to FIG. 1, the region (a) includes the cylindrical first recess region 14 formed in the semiconductor substrate 10. A sidewall and a lower surface of the first recess region 14 are covered with a first ONO layer 24. The inside of the first ONO layer 24 is covered with a first gate electrode 20. On the semiconductor substrate 10 surrounding the first ONO layer 24, at least the first impurity regions 30a and 30b adjoin a side surface of the first ONO layer 24 by forming a relative angle α less than 120°, and which may be a right angle, therebetween with respect to the centers of the first impurity regions 30a and 30b and the center of the first gate electrode 20.

The region (a) is repeated by repeating in a direction a pair of first gate electrode arrays 60 that includes the plurality of first gate electrodes 20 buried within the plurality of first ONO layers 24. The first gate electrode arrays 60 include a first gate electrode arrangement 61 (illustrated by line arrangement) repeated in one direction and a second gate electrode arrangement 62 (illustrated by line arrangement) repeated in the same direction as the first gate electrode arrangement 61 and spaced apart from the first gate electrode arrangement 61 by a defined distance. The first gate electrode arrays 60 are repeated on the non-volatile memory device.

The plurality of first impurity regions 30a and 30b adjoining the side surfaces of the plurality of the first ONO layers 24 are repeated in the same direction as the first gate electrode arrays 60. According to the first embodiment, the plurality of the first impurity regions 30a and 30b may be arranged only between the first gate electrode arrangement 61 and the second gate electrode arrangement 62. Therefore, the plurality of the first impurity regions 30a and 30b respectively adjoin opposite facing sides of each of the first gate electrode arrangements 61 and the second gate electrode arrangements 62.

The first gate electrode arrays 60 directly contact a plurality of word lines 50 to be electrically connected thereto. The plurality of word lines 50 can each include a first bit line 51 and a second bit line 52. The first bit lines 51 respectively directly contact the repeated first gate electrodes 20 of the first gate electrode arrangement 61. The first bit line 51 is not electrically connected to the adjoining second gate electrode arrangement 62. The second gate electrode arrangement 62 makes contact with the second bit line 52. In this way, multi-bit data can be independently stored in and erased from the respective first gate electrodes 20 that form the region (a) in accordance with the first embodiment.

The first impurity regions 30a and 30b are repeated to form a first impurity region array 71. The first impurity region array 71 is electrically contact with a first word line 55 to be externally electrically connected. In accordance with the first embodiment of the present invention, the first gate electrode arrangement 61, the second gate electrode arrangement 62 and the first impurity region array 71, which form a defined unit, are repeated in nonvolatile memory device.

FIGS. 2A through 6A are plan views of the region (a) of FIG. 1 that illustrate a method of manufacturing the nonvolatile memory device according to the first embodiment of the present invention. FIGS. 2B through 6B are sectional views along line I-I of FIG. 1 of the nonvolatile memory device.

Figure 2A:
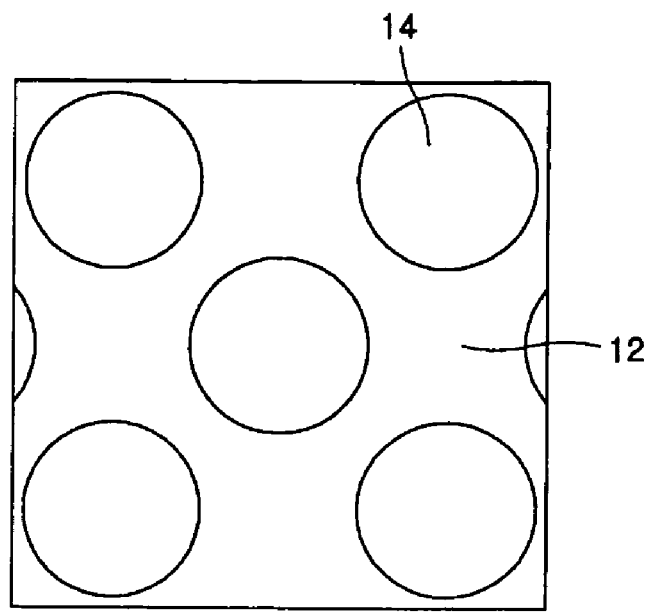
Figure 2B:
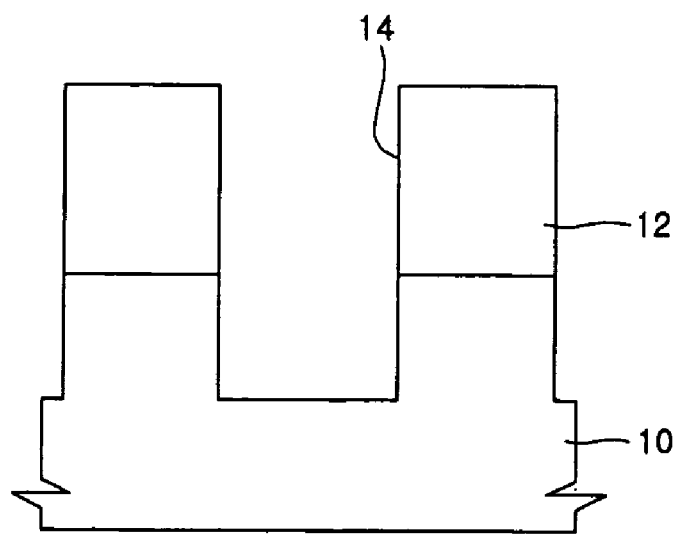

Referring to FIGS. 2A and 2B, a first mask insulating layer 12 is formed on the semiconductor substrate 10. A first photoresist pattern (not shown) for defining the first recess region 14 that is cylindrical is then formed on the first mask insulating layer 12. The first mask insulating layer 12 is etched according to the shapes defined by the first photoresist pattern. After removing the first photoresist pattern, an upper portion of the semiconductor substrate 10 is etched using the first mask insulating layer 12 as an etch mask to form the first recess region 14 having a first cylindrical shape. The first recess region 14 may be formed by dry etching such as plasma etching or reactive ion etching.

Figure 3A:
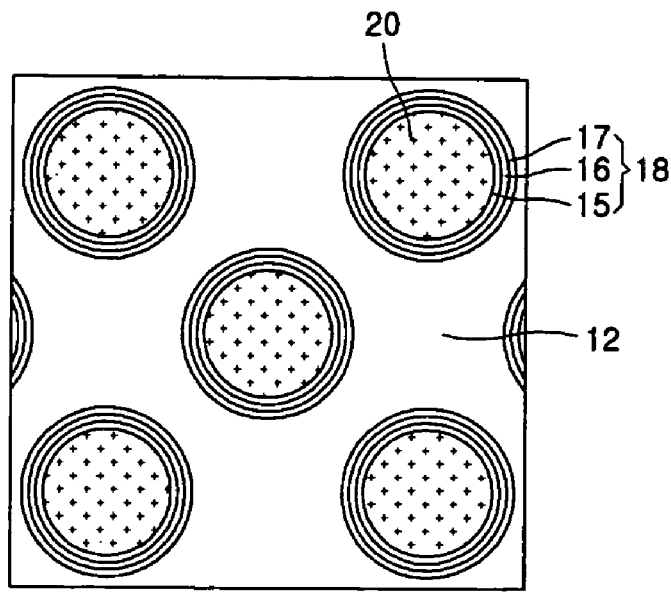
Figure 3B:
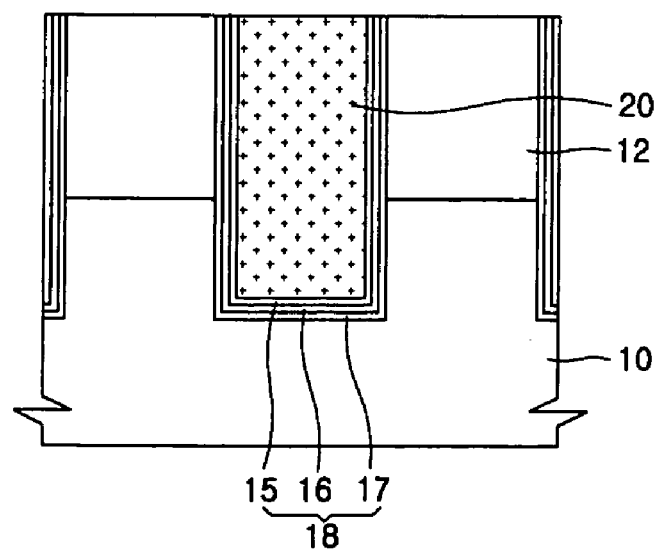

Referring to FIGS. 3A and 3B, an ONO material layer 18 is formed to cover a sidewall and lower surfaces of the first recess region 14 as a blanket. The ONO material layer 18 may include the same material as that of the first ONO layer 24 which will be described below with reference to FIG. 4. A first gate electrode material layer (not shown) is then buried within the ONO material layer 18. The gate electrode 20 is formed on the ONO material layer 18 in the first access region 14. The gate electrode 20 may be formed from, but is not limited to, a material that may include a single material selected from the group consisting of amorphous polysilicon, doped polysilicon, poly-SiGe and a conductive material containing metal, or a composite layer. The conductive material containing metal may be selected from, but is not limited to, the group consisting of a metal such as tungsten or molybdenum, and a conductive metal nitride such as TiN, TaN or WN. The first gate electrode material layer is planarized to be aligned with an adjacent major upper surface of the ONO material layer 18 and the first mask insulating layer 12 to form the first gate electrode 20.

Figure 4A:
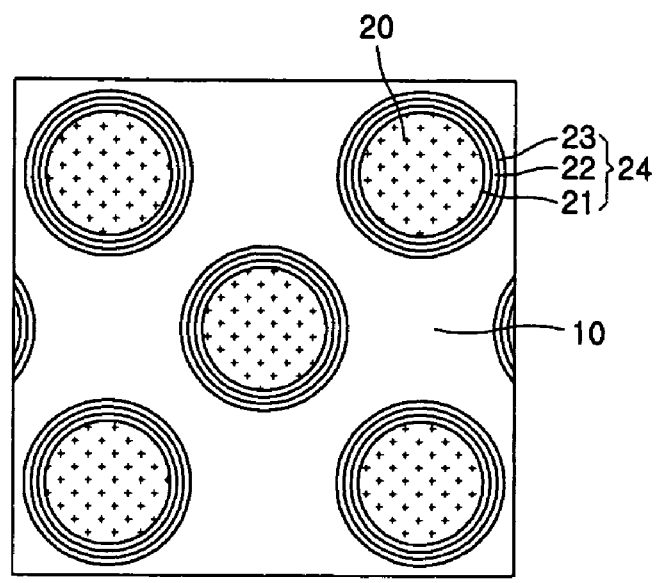
Figure 4B:
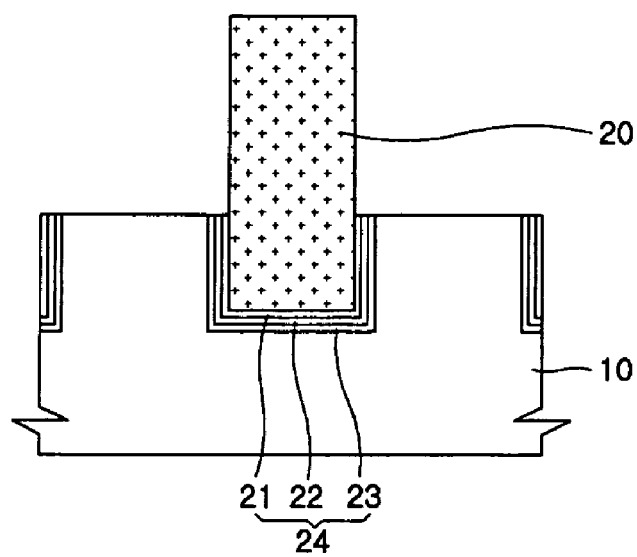

Referring to FIGS. 4A and 4B, the ONO material layer 18 and the first mask insulating layer 12 are removed using the first gate electrode 20 as an etch mask so as to expose the semiconductor substrate 10. The nitride layer may be removed using $H_3PO_4$, etc., and the oxide layer may be removed using diluted HF, diluted $NH_4F$ or a Buffered Oxide Etchant (BOE) such as a mixture of HF and de-ionized water. The remaining ONO material layer 18 can thereby form the first ONO layer 24 which serves as a gate insulating layer. Accordingly, the first gate electrode 20 protrudes a predetermined height away from the semiconductor substrate 10. Additionally, the first ONO layer 24 covering the side surface of the first recess region 14 will be used as a channel region as will be describe below.

Figure 5A:
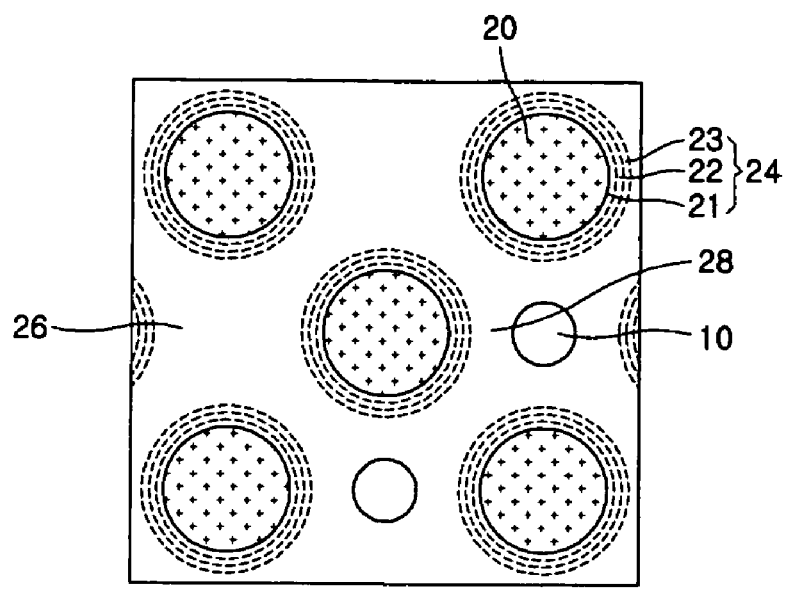
Figure 5B:
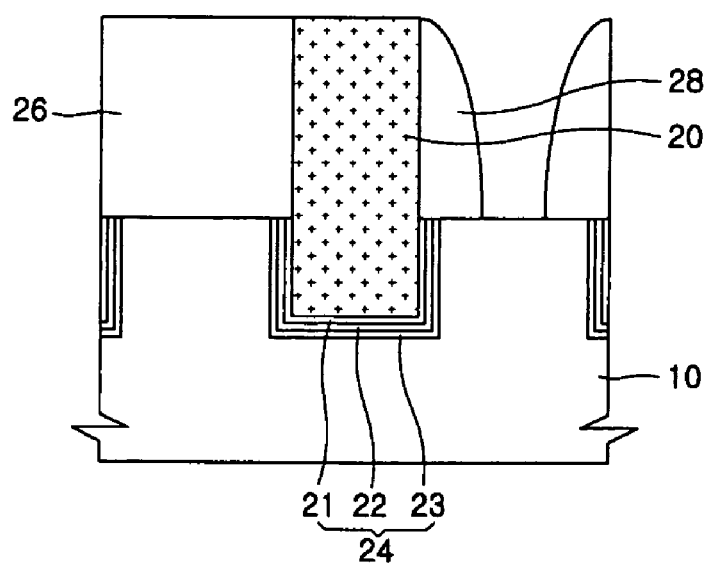

Referring to FIGS. 5A and 5B, a second mask insulating layer 26 as high and thick as the first gate electrode 20 is formed on the upper surface of the semiconductor substrate 10 where the first gate electrode 20 is formed. The second mask insulating layer 26 can be formed from silicon nitride. A second photoresist pattern (not shown) for forming the first impurity regions 30a and 30b is then formed thereon. Using the second photoresist pattern as an etch mask, the second mask insulating layer 26 is etched to expose the region of the semiconductor substrate 10 on which the first impurity regions 30a and 30b will be formed.

When the first impurity regions 30a and 30b are formed, the height of the first gate electrode 20 may be the same as an interval between the first gate electrodes 20, which may allow corresponding areas of the semiconductor substrate 10 to be exposed under the same etching conditions. When overall etching is performed, a spacer 28 is formed on one side of the first gate electrode 20. Accordingly, except from exposed region, the semiconductor substrate 10 is covered by the etched second mask insulating layer 26, the spacer 28 and the first gate electrode 20.

Figure 6A:
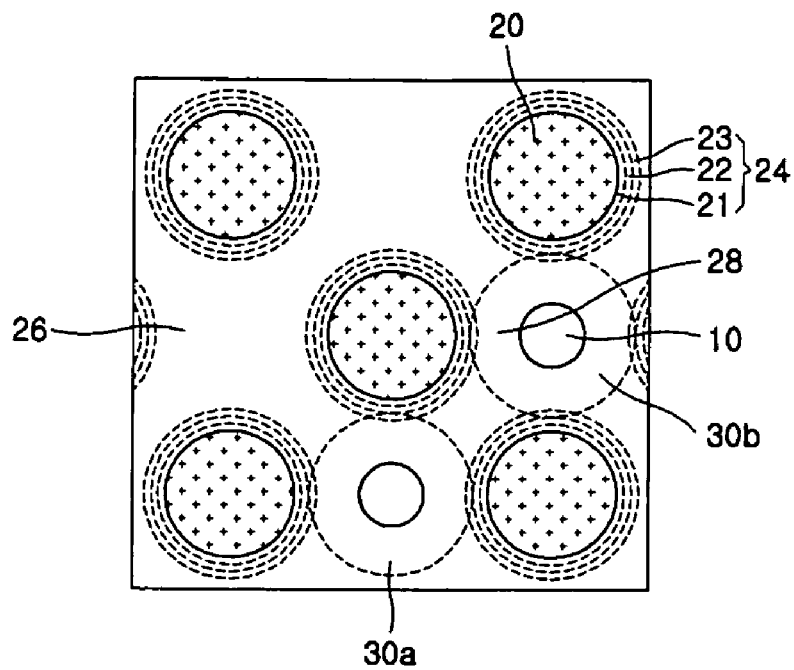
Figure 6B:
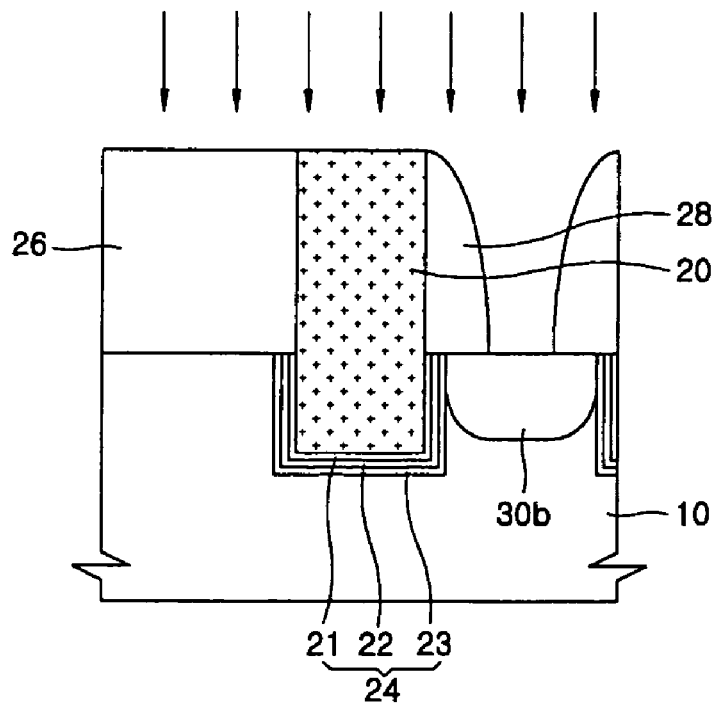

Referring to FIGS. 6A and 6B, an impurity is doped into the exposed surface of the semiconductor substrate 10, thereby forming the first impurity regions 30a and 30b.

Figure 7A:
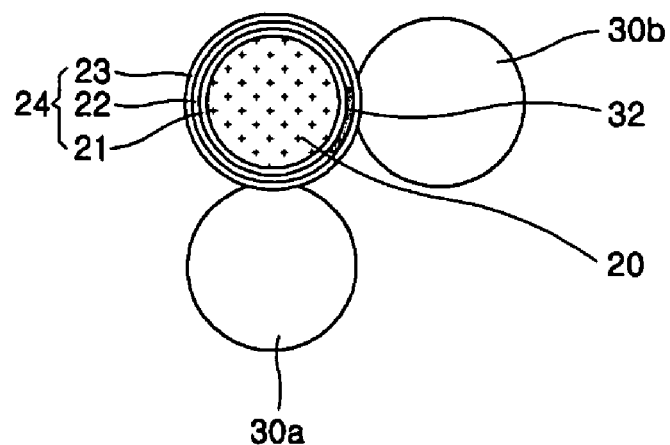
FIGS. 7A and 7B are plan views illustrating how data can be stored in the nonvolatile memory device illustrated in FIG. 1.
Figure 7B:
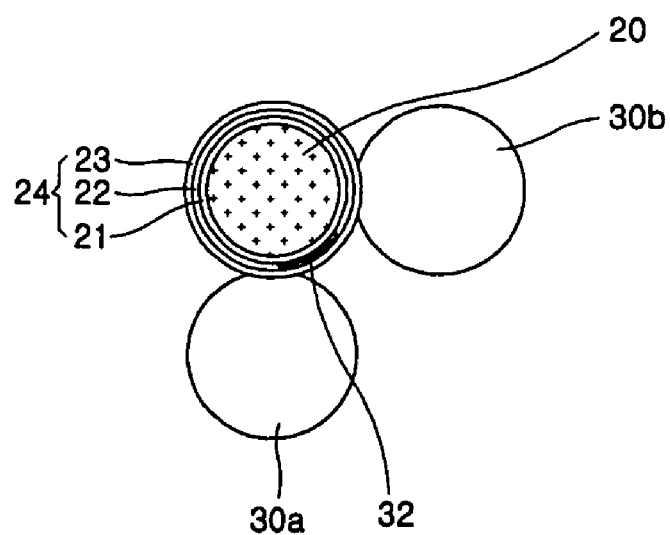

FIGS. 7A and 7B are plan views illustrating data storage in the nonvolatile memory device according to the first embodiment of the present invention. Data is stored in the nitride layer, that is, the charge trapping insulating layer 22, of the first ONO layer 24.

Referring to FIG. 7A, the impurity region 30b, which may be a drain region, is formed on a first side, e.g., the illustrated right side of the first gate electrode 20, and the impurity region 30a, which may be a source region, is formed on a second side, e.g., the illustrated lower side of the first gate electrode 20. When the first gate electrode 20 and the impurity region 30b, are respectively supplied with a voltage, data is stored in a programming region 32 adjacent to the impurity region 30b.

Referring to FIG. 7B, the impurity region 30a, which may be a drain region, is formed on a first side, e.g., the illustrated lower side of the first gate electrode 20, and the impurity region 30b, which may be a source region, is formed on a second side, e.g., the illustrated right side of the first gate electrode 20. When the first gate electrode 20 and the impurity region 30a, are respectively supplied with a voltage, data is stored in a programming region 32 adjacent to the impurity region 30a.

Referring to FIG. 1, the nonvolatile memory device according to the first embodiment of the present invention has the first gate electrode 20 in the form of a recessed groove on the semiconductor substrate 10. The first gate electrode 20 is formed in the groove-shaped first recess region 14, which provides a basic structure of a multi-bit memory device to be described later. Also, there can be a large distance between each of the first word lines 55, affording a large margin when manufacturing the memory device.

Second Embodiment of the Present Invention

Figure 8:
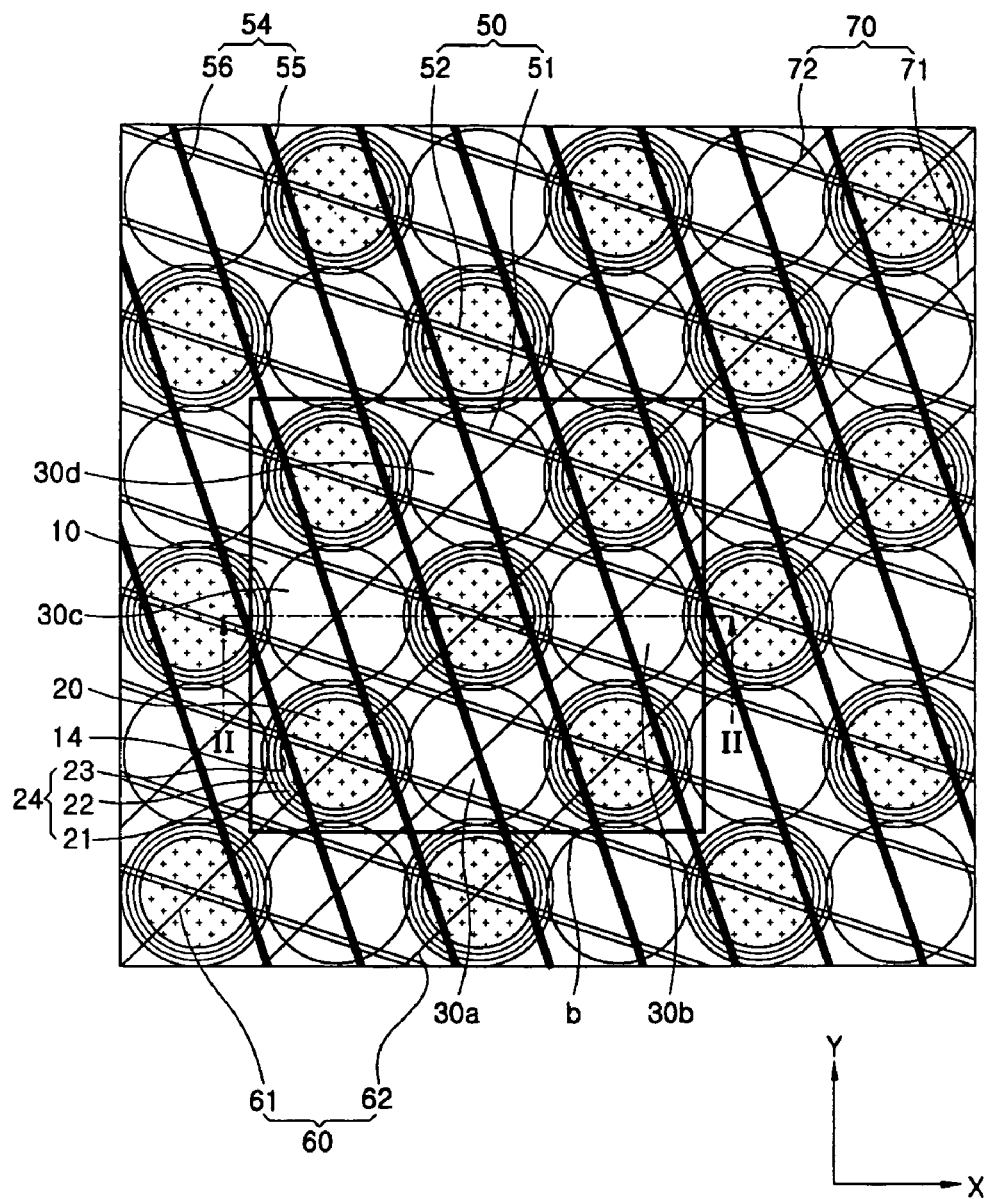
FIG. 8 is a plan view of a nonvolatile memory device according to a second embodiment of the present invention.
Figure 9A:
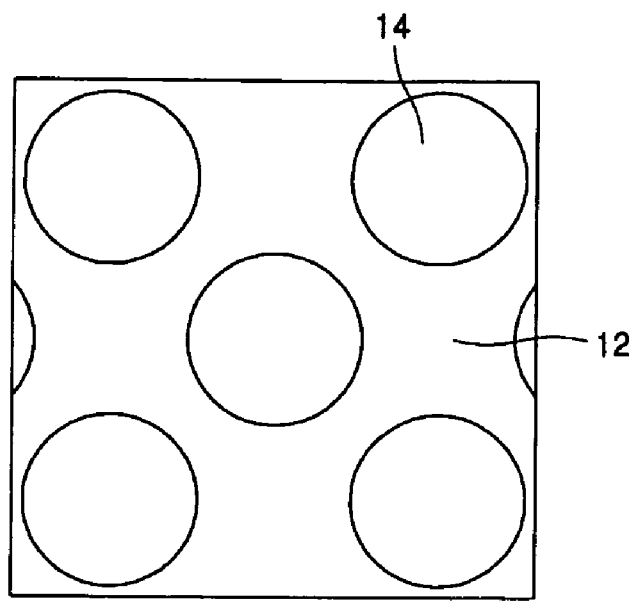
Figure 9B:
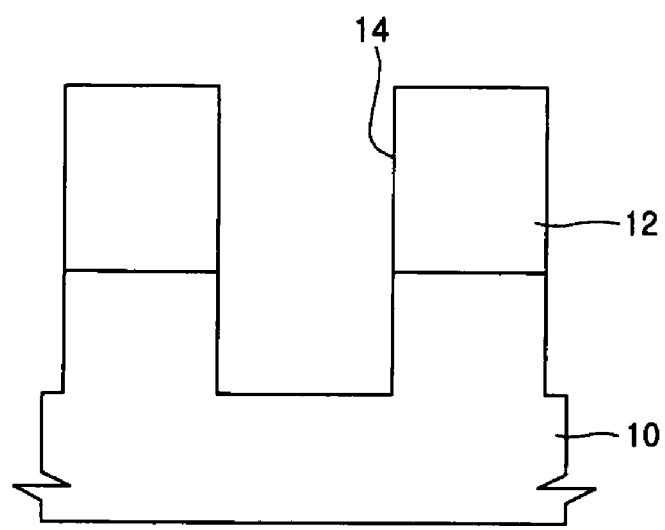
Figure 10A:
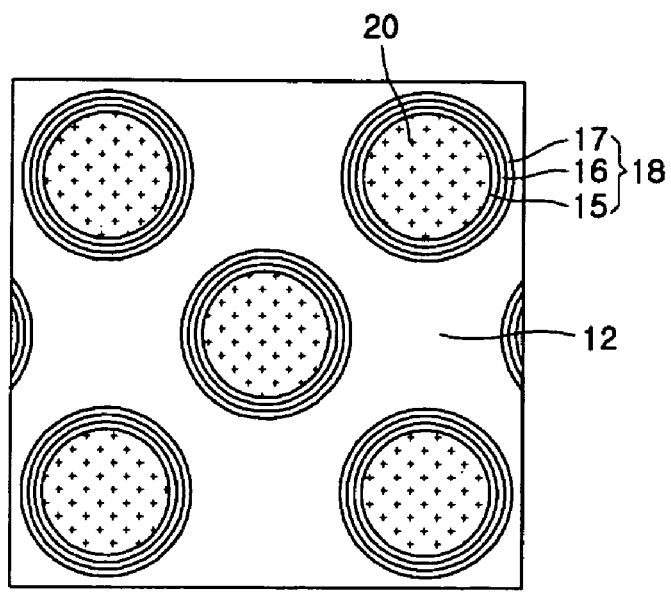
Figure 10B:
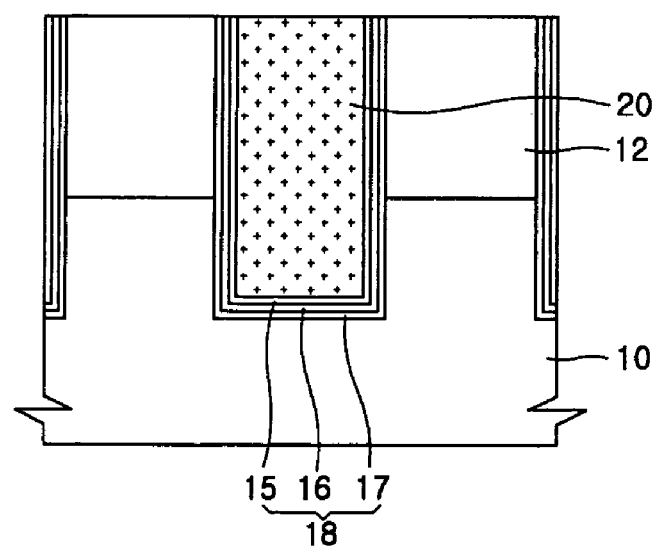
Figure 11A:
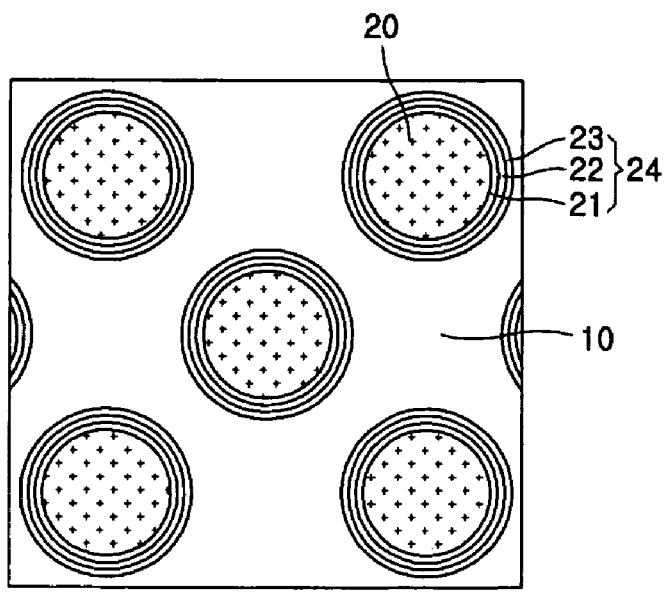
Figure 11B:
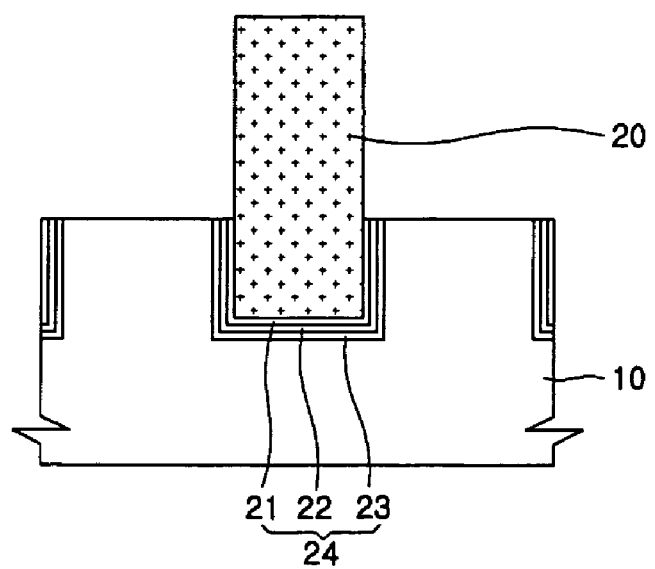

Referring to FIG. 8, a nonvolatile memory device according to the second embodiment of the present invention includes two pairs of impurity regions 30a, 30b and 30c, 30d adjoining the first gate electrode 20. The first gate electrode 20 is buried in the first cylindrical recess region 14 and protrudes from the semiconductor substrate 10. Related methods of manufacturing the nonvolatile memory device are also explained below.

FIG. 8 is a plan view of the nonvolatile memory device, which includes a region (b) corresponding to the unit cell according to the first embodiment. The region (b) is repeated on the same plane in the X-axis direction and the Y-axis direction. For convenience, some parts such as the spacer 28 explained above are not shown in FIG. 8.

The first gate electrode 20, the first ONO layer 24, the first gate electrode arrays 60 and the bit lines 50 can be the same as those described with reference to FIG. 1, and thus their description will not be repeated for the second embodiment.

Referring to FIG. 8, in the memory device according to the second embodiment, the first gate electrode arrangement 61 and the second gate electrode arrangement 62 adjoin the two pairs of impurity regions 30a, 30b and 30c, 30d. The two pairs of impurity regions 30a, 30b and 30c, 30d form defined impurity region arrays 70. The impurity region array 70 includes first impurity region arrangement 71 repeated in the same direction as the first gate electrode arrangement 61 and adjoining a first side of the first gate electrode arrangement 61. Also, a second impurity region arrangement 72 spaced apart from the first impurity region arrangement 71 by a predetermined distance is repeated in the same direction as the first gate electrode arrangement 61 while adjoining a second side of the first gate electrode arrangement 61.

The impurity region arrays 70 can directly contact and electrically connect with the plurality of bit lines 54, and thereby can be electrically connected to external lines. The plurality of bit lines 54 are formed by repeating a defined unit that includes a first bit line 55 and a second bit line 56. The first bit line 55 electrically connects the respective first impurity regions 30a and 30b of the first impurity region arrangement 71. The second impurity region arrangement 72 is externally and electrically connected to the second bit line 56 without contacting the first bit line 55.

FIGS. 9A through 13A are plan views of the unit cell (b) of FIG. 8 and illustrate methods of manufacturing the nonvolatile memory device according to the second embodiment of the present invention. FIGS. 9B through 13B are sectional views along line II-II of FIG. 8 of the nonvolatile memory device. FIGS. 9A through 11B showing the manufacture of the first gate electrode 20 and the first ONO layer 24 are the same as FIGS. 2A through 4B. Therefore, corresponding descriptions will be omitted.

Figure 12A:
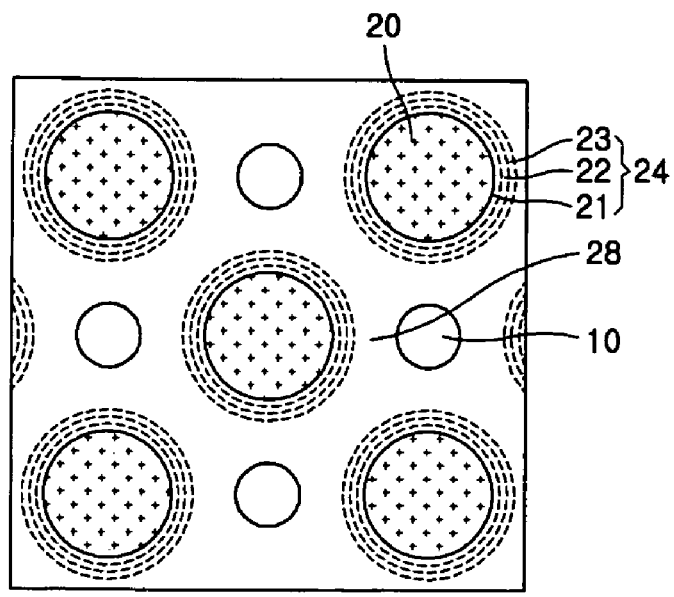
Figure 12B:
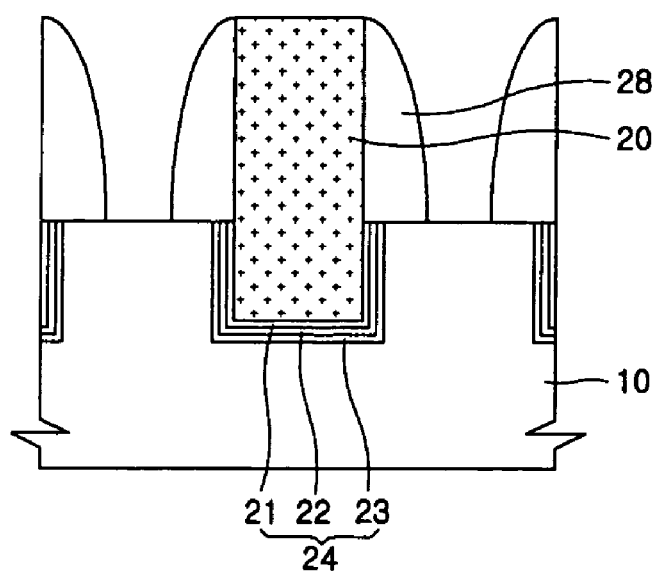

Referring to FIGS. 12A and 12B, the first impurity regions 30a and 30b and the second impurity regions 30c and 30d are opposite to each other about the first gate electrode 20. The first impurity regions 30a and 30b and the second impurity regions 30c and 30d can be simultaneously formed. The impurity regions can be formed by forming a second mask insulating layer 26 on the upper surface of the semiconductor substrate 10 where the first gate electrode 20 is formed. Thereafter, the second mask insulating layer 26 is etched, thereby exposing the region of the semiconductor substrate 10 on which the first impurity regions 30a and 30b and the second impurity regions 30c and 30d are to be formed.

When forming the first impurity regions 30a and 30b and the second impurity regions 30c and 30d, the height of the first gate electrode 20 may be the same as the distance between the first gate electrodes 20, which may allow corresponding areas of the semiconductor substrate 10 to be exposed under the same etching conditions. When overall etching is performed, the spacer 28 is formed around the first gate electrode 20. Accordingly, except for the exposed region, the semiconductor substrate 10 can be covered by the etched spacer 28 and the first gate electrode 20.

Figure 13A:
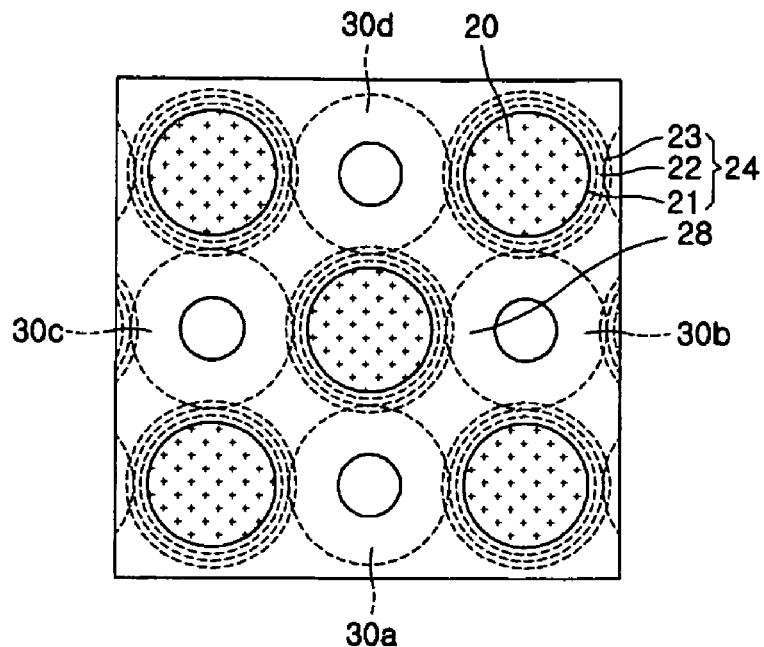
Figure 13B:
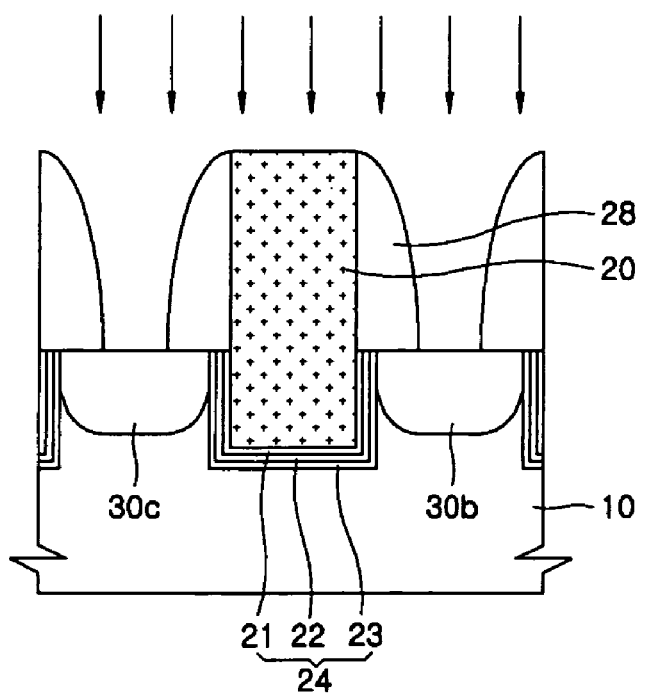

Referring to FIGS. 13A and 13B, an impurity is doped into the exposed surface of the semiconductor substrate 10, thereby forming the first impurity regions 30a and 30b and the second impurity regions 30c and 30d.

FIGS. 14A through 14D are plan views illustrating data stored in the nonvolatile memory device according to the second embodiment of the present invention. Data can be stored in the nitride-composed charge trapping insulating layer 22 of the first ONO layer 24.

Figure 14A:
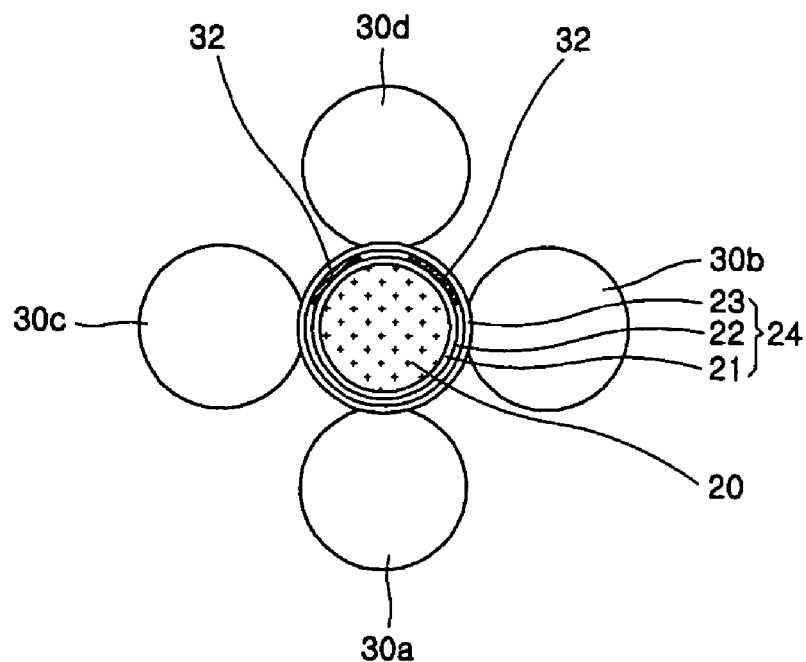
FIGS. 14A through 14D are plan views illustrating how data can stored in the nonvolatile memory device illustrated in FIG. 8.

Referring to FIG. 14A, the impurity region 30d, which may be a drain region, is formed on a first side, e.g., shown as an upper side of the first gate electrode 20, and the impurity regions 30b and 30c, which may to be source regions, are respectively formed on the illustrated right and left sides of the first gate electrode 20. When the first gate electrode 20 and the impurity region 30d, are respectively supplied with a voltage, data is stored in a programming region 32 close to the impurity region 30d, and 2-bit data corresponding to the respective impurity regions 30b and 30c may be stored therein.

Figure 14B:
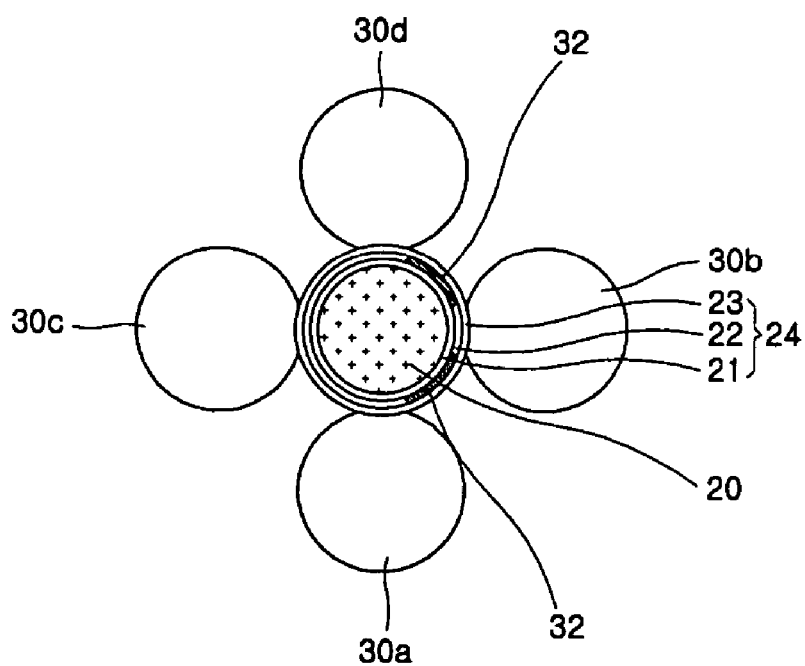

Referring to FIG. 14B, the impurity region 30b, which may be a drain region, is formed on a first side, e.g., shown on a right side of the first gate electrode 20, and the impurity regions 30a and 30d, which may be source regions, are respectively formed on the lower and upper sides of the first gate electrode 20. When the first gate electrode 20 and the impurity region 30b, are respectively supplied with a voltage, data is stored in a programming region 32 close to the impurity region 30b, and 2-bit data corresponding to the respective impurity regions 30a and 30d may be stored therein.

Figure 14C:
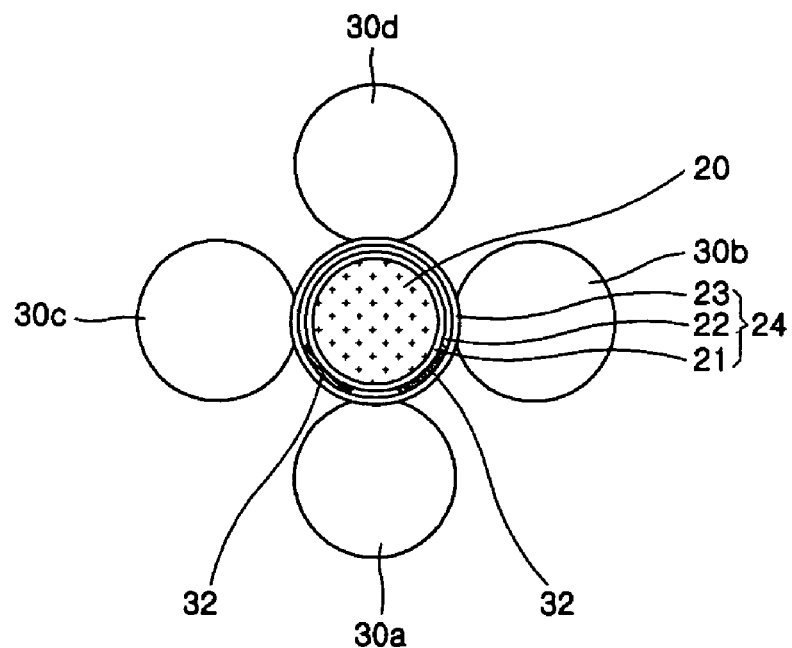

Referring to FIG. 14C, the impurity region 30a, which may be a drain region, is formed on a first side, e.g., shown on lower side of the first gate electrode 20, and the impurity regions 30b and 30c, which may be source regions, are respectively formed on illustrated right and left sides of the first gate electrode 20. When the first gate electrode 20 and the impurity region 30a, are respectively supplied with a voltage, data is stored in a programming region 32 close to the impurity region 30a, and 2-bit data corresponding to the respective impurity regions 30b and 30c may be stored therein.

Figure 14D:
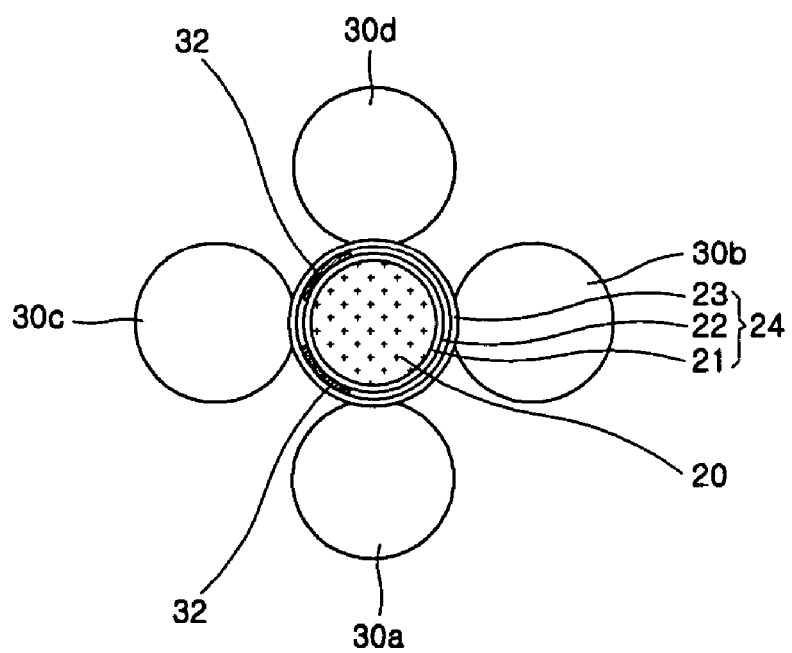

Referring to FIG. 14D, the impurity region 30c, which may be a drain region, is formed on a first side, e.g., shown on left side of the first gate electrode 20, and the impurity regions 30a and 30d, which may be source regions, are respectively formed on the illustrated lower and upper sides of the first gate electrode 20. When the first gate electrode 20 and the impurity region 30c, are respectively supplied with a voltage, data is stored in a programming region 32 close to the impurity region 30c, and 2-bit data corresponding to the respective impurity regions 30a and 30d may be stored therein.

Accordingly, the nonvolatile memory device according to the second embodiment of the present invention may store 8 bits in a unit cell. The multi-bit data can be stored in four adjoining transistors by commonly sharing the source regions and the drain region. In the four adjoining transistors, the data is stored in respective transistors in accordance with a selected drain region. Additionally, the spacer 28 may be used when the impurity regions are formed in the memory device to possibly simplify the manufacturing process.

Third Embodiment of the Present Invention

A nonvolatile memory device according to the third embodiment of the present invention includes a second gate electrode 34 that is buried in the first cylindrical recess region 14 and has an upper surface that is aligned with an adjacent major upper surface of the semiconductor substrate 10, and further includes first impurity regions 30a and 30b. Related methods of manufacturing the nonvolatile memory device are also explained below.

The first ONO layer 24, the bit lines 50 and the first bit lines 55 may be the same as those of the first embodiment described with reference to FIG. 1.

The arrays of the second gate electrodes 34 may be arranged in a similar manner to the first gate electrode arrays 60 of the first embodiment. The unit cell may be similar to the region (a) of FIG. 1 except for the second gate electrode 34. Consequently, the third embodiment will be described with emphasis on methods of forming the second gate electrode 34.

FIGS. 15A through 17A are plan views of the unit cell (a) of FIG. 1 that illustrate methods of manufacturing the nonvolatile memory device according to the third embodiment of the present invention. FIGS. 15B through 17B are sectional views along line I-I of FIG. 1 of the third embodiment of the present invention.

Figure 15A:
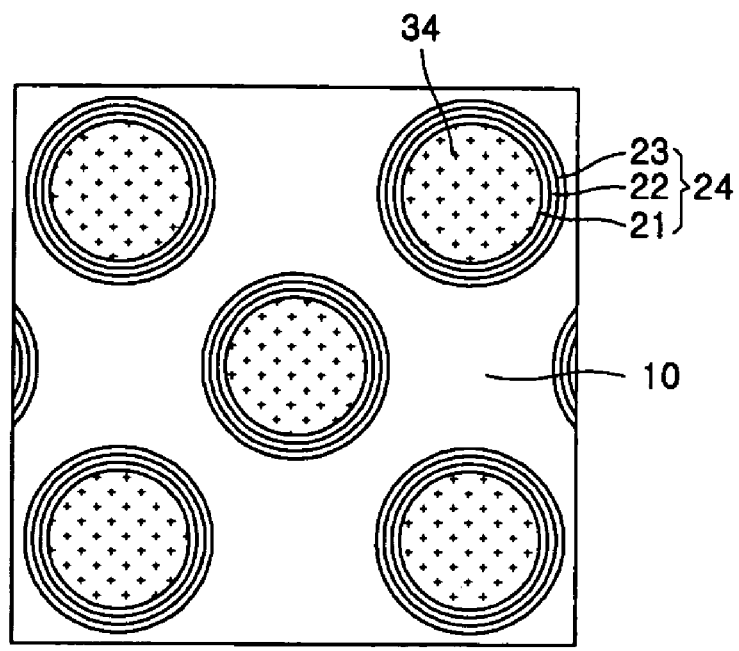
Figure 15B:
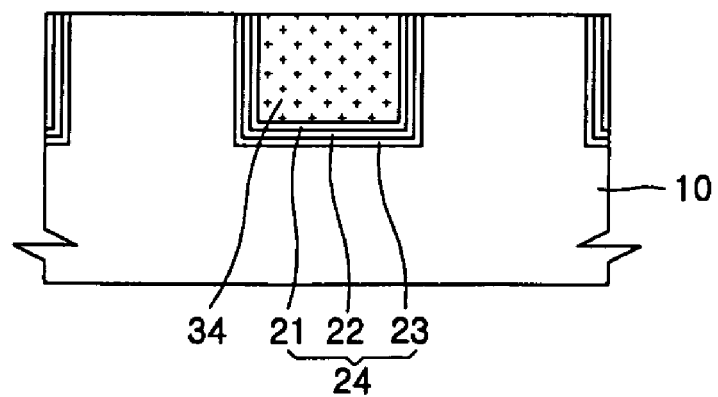

Referring to FIGS. 15A and 15B, when forming the second gate electrode 34 level with the semiconductor substrate 10, an ONO material layer (not shown) can be first formed on the side surface and the lower surface of the first recess region 14 as a blanket. Thereafter, a second gate electrode material layer (not shown) can be formed on the ONO material layer in the first recess region 14. The second gate electrode material layer is planarized so as to expose the upper surface of the semiconductor substrate 10, thereby forming the second gate electrode 34.

Figure 16A:
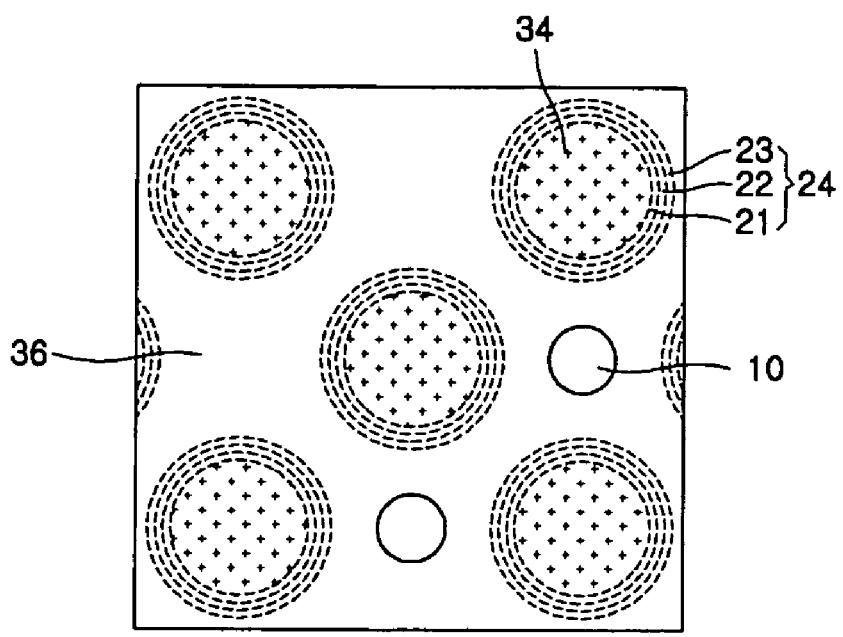
Figure 16B:
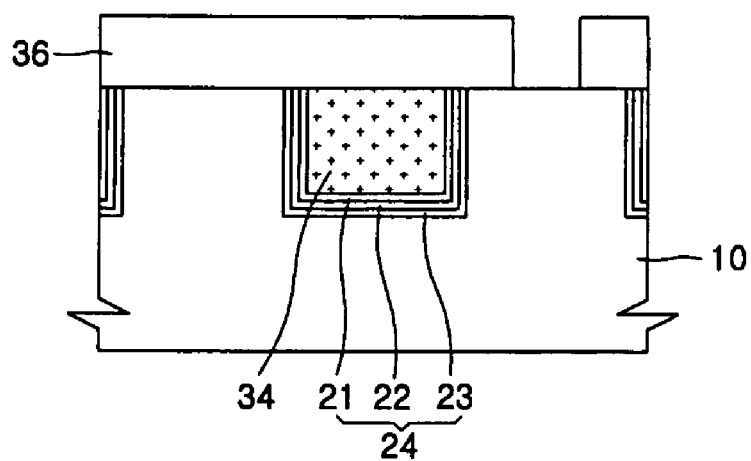

Referring to FIGS. 16A and 16B, a first mask insulating layer pattern 36 is formed on the upper surface of the semiconductor substrate 10 where the second gate electrode 34 is formed and while exposing the region of the semiconductor substrate 10 where the first impurity regions 30a and 30b are to be formed. The first impurity regions 30a and 30b are formed on respective sides of the second gate electrode 34 about the second gate electrode 34.

Figure 17A:
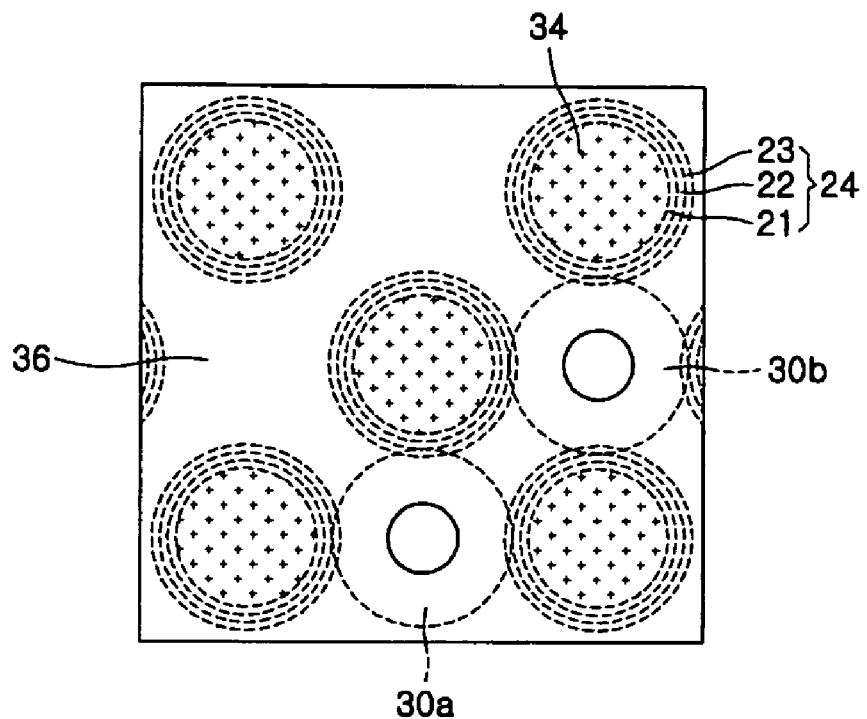
Figure 17B:
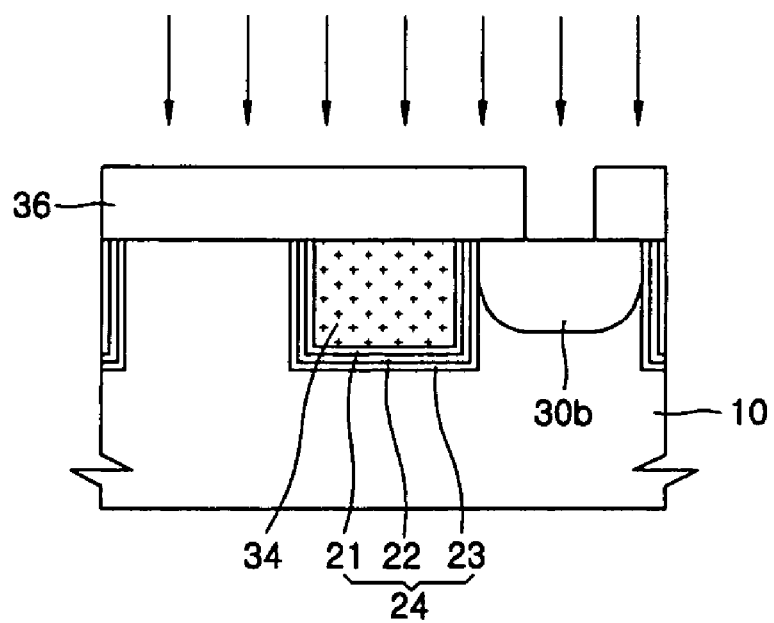

Referring to FIGS. 17A and 17B, using the first mask insulating layer pattern 36 as an ion implanting mask, an impurity is doped into the exposed surface of the semiconductor substrate 10, thereby forming the first impurity regions 30a and 30b.

The nonvolatile memory device according to the third embodiment of the present invention may allow improved packing density due to the decreased height of the second gate electrode 34.

Fourth Embodiment of the Present Invention

A nonvolatile memory device according to the fourth embodiment of the present invention includes a second gate electrode 34 which is buried in the first cylindrical recess region 14 and has an upper surface that is aligned with an adjacent major upper surface of the semiconductor substrate 10, and further includes two pairs of impurity regions 30a, 30b, and 30c 30d. Related methods of manufacturing the nonvolatile memory device are also explained below.

The first ONO layer 24, the word lines 50 and the bit lines 55 may be the same as those of the second embodiment. The arrays of the second gate electrodes 34 may be arranged in a similar manner to the first gate electrode arrays 60 of the second embodiment. The unit cell may be the same as the region (b) of FIG. 8 except for the second gate electrode 34. Consequently, the fourth embodiment will be described with emphasis on methods of forming the second gate electrode 34.

FIGS. 18A through 20A are plan views of the unit cell (b) of FIG. 8 that illustrate methods of manufacturing the nonvolatile memory device according to the fourth embodiment of the present invention. FIGS. 18B through 20B are sectional views along line II-II of FIG. 8 of the nonvolatile memory device that further illustrate the fourth embodiment of the present invention.

Figure 18A:
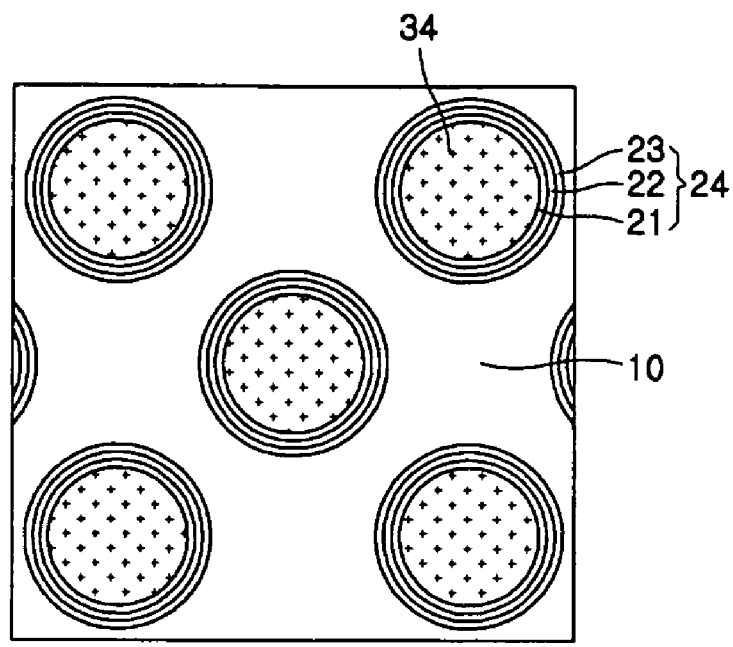
Figure 18B:
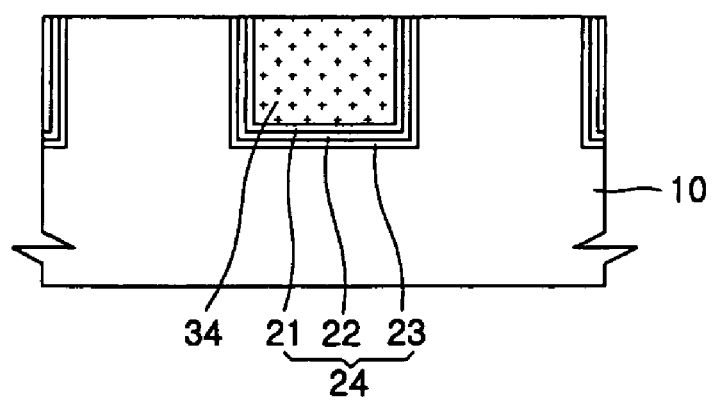

Referring to FIGS. 18A and 18B, when forming the second gate electrode 34 level with a surface of the semiconductor substrate 10, the ONO material layer (not shown) is first formed on the side surface and the lower surface of the first recess region 14 as a blanket. Thereafter, a second gate electrode material layer (not shown) is formed on the ONO material layer in the first recess region 14. The second gate electrode material layer (not shown) is planarized so as to expose the upper surface of the semiconductor substrate 10, thereby forming the second gate electrode 34.

Figure 19A:
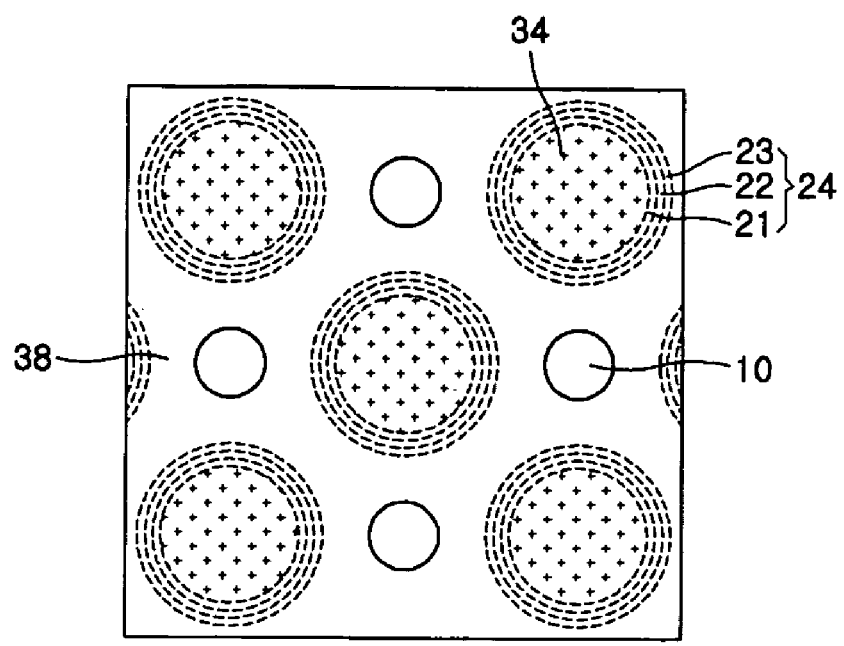
Figure 19B:
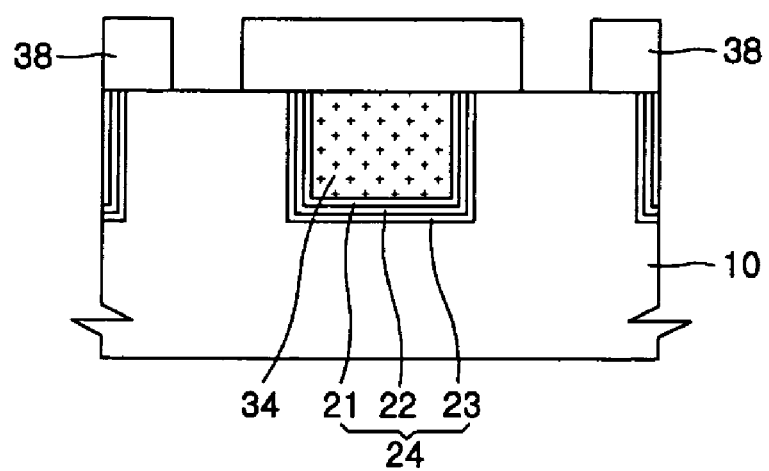

Referring to FIGS. 19A and 19B, a second mask insulating layer pattern 38 is formed on the upper surface of the semiconductor substrate 10 and that exposes the semiconductor substrate 10 where the first impurity regions 30a and 30b and the second impurity regions 30c and 30d are to be formed. The first impurity regions 30a and 30b are opposite to the second impurity regions 30c and 30d with the second gate electrode 34 interposed therebetween.

Figure 20A:
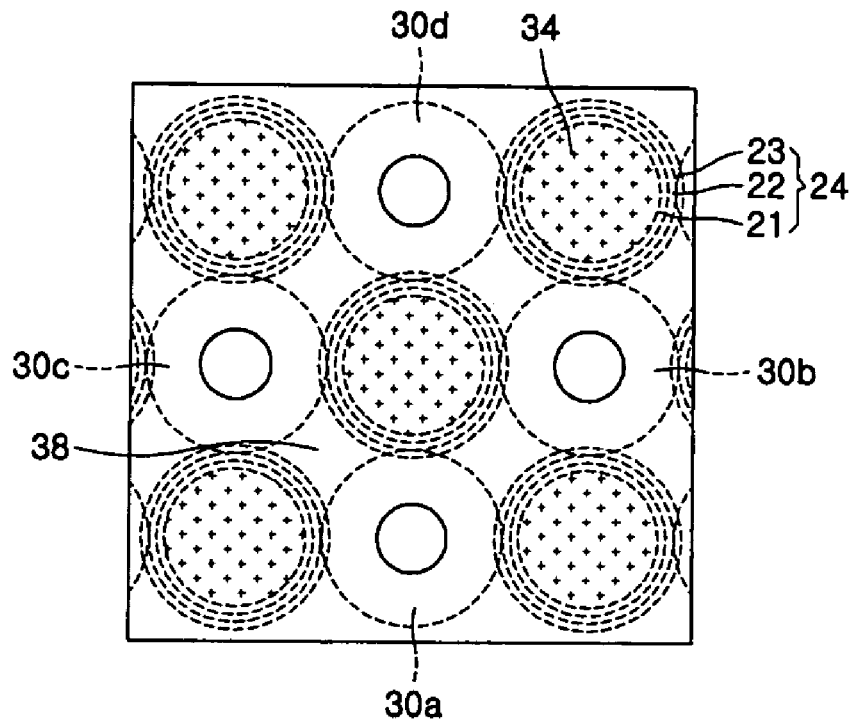
Figure 20B:
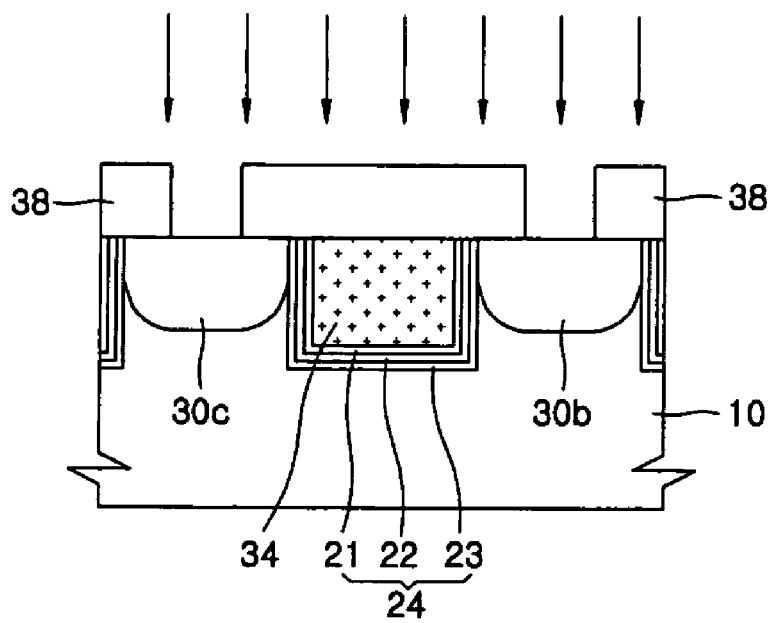

Referring to FIGS. 20A and 20B, an impurity is doped into the upper surface of the semiconductor substrate 10 using the second mask insulating layer pattern 38 as an ion implanting mask, thereby forming the first impurity regions 30a and 30b and the second impurity regions 30c and 30d.

Fifth Embodiment of the Present Invention

A nonvolatile memory device according to the fifth embodiment of the present invention includes a third gate electrode 46 that is buried in a second recess region 40 with a cubic shape. Related methods of manufacturing the nonvolatile memory device are also explained below.

The impurity region arrays 70, the bit lines 50 and the word lines 55 may be the same as those of the first and second embodiments described with reference to FIGS. 1 and 8. Furthermore, the arrays of the third gate electrodes 46 may be the same as the gate electrode arrays 60 of the first through fourth embodiments. The unit cell may be the same as the unit cells (a) and (b) of FIGS. 1 and 8, except for the first and second gate electrodes 14 and 34. Consequently, the fifth embodiment will be described with emphasis on methods of forming the third gate electrode 46.

Figure 21:
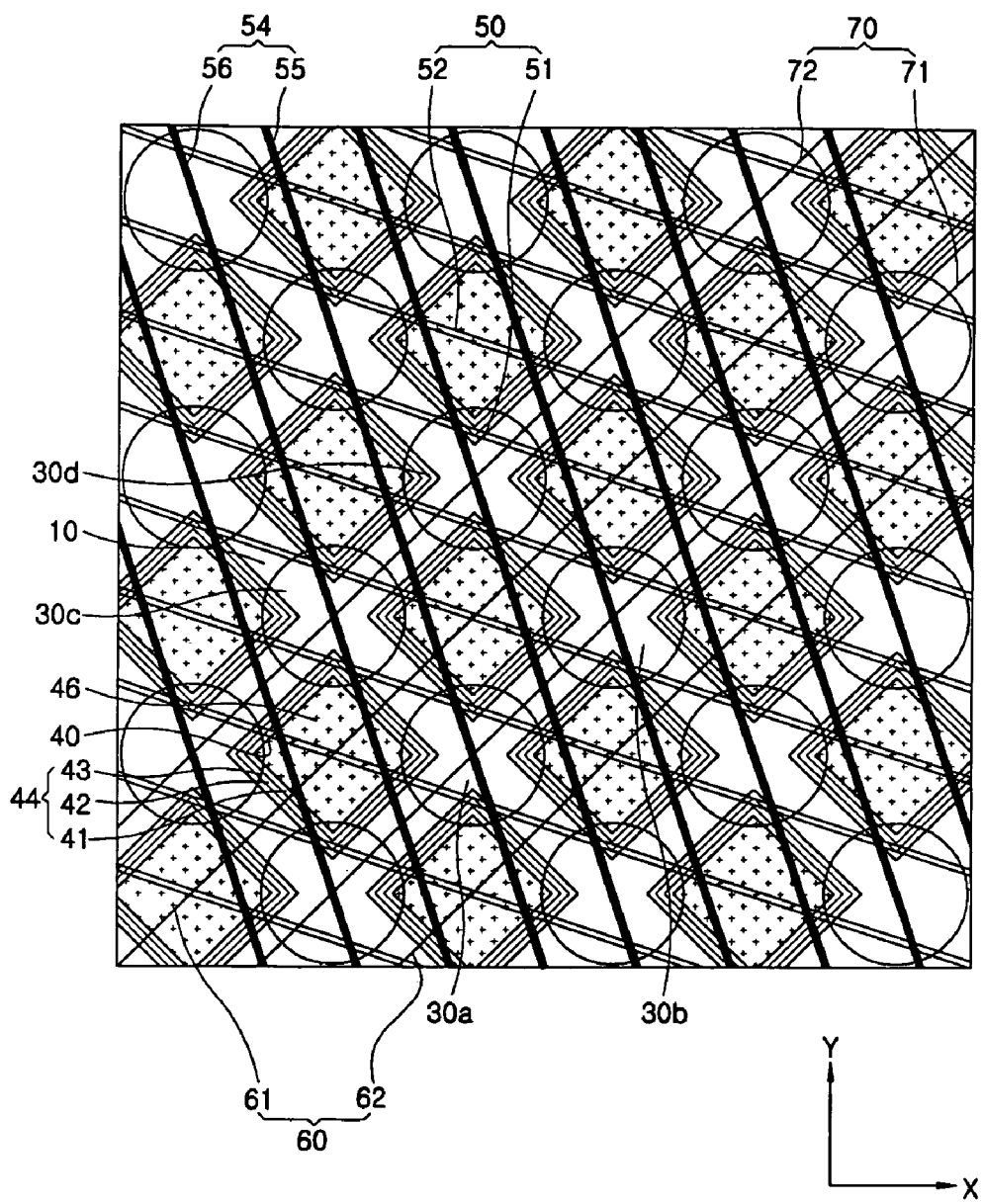
FIG. 21 is a plan view of the nonvolatile memory device according to a fifth embodiment of the present invention.

FIG. 21 is a plan view of the nonvolatile memory device according to the fifth embodiment of the present invention.

Referring to FIG. 21, when forming a second recess region 40, the first mask insulating layer 12 is first formed on the upper surface of the semiconductor substrate 10. A second photoresist pattern (not shown) for defining a recess region with a second cylindrical shape is then formed on the first mask insulating layer 12. Using the second photoresist pattern as an etch mask, the first mask insulating layer 12 and an upper surface of the semiconductor substrate 10 are etched to form a second cylindrical groove (not shown). The semiconductor substrate 10 formed with the second cylindrical groove is wet etched using an etchant including TetraMethylAmmoniumHydroxide (TMAH), thereby forming a polyhedron-shaped second recess region 40 with corners. Wet etching using TMAH allows for selectively etching the semiconductor substrate 10 along a crystalline plane. A diameter of the second cylindrical groove may be smaller than that of the first cylindrical groove, due to enlargement of the second cylindrical groove by the wet etching.

Corner areas of the second recess region 40 adjoin the impurity regions 30a, 30b, 30c and 30d. Accordingly, areas adjoining the subsequently formed second ONO layer 44, the sharply-bent third gate electrode 46 and the impurity regions 30a, 30b, 30c and 30d can be widener than otherwise. The second recess region 40 among the impurity regions 30a, 30b, 30c and 30d may have a linear profile, which may widen (increase) an interval between neighboring second recess regions 40 and may improve the associated margins.

Accordingly, at least 2 bits of multi-bit data can be stored in a groove-shaped gate electrode recessed in the substrate 10.

By modifying the shape of the recessed groove, the memory device can display different bit storage characteristics.

Furthermore, because the height of the gate electrode protruding from the semiconductor substrate can be adjusted, the characteristics and packing density of the memory device can be controlled accordingly.

Although various embodiments of the present invention have been described in the context of using cylindrical or rectangular grooves, it is to be understood that the invention is not limited thereto and may instead may use other shapes. Additionally, a dielectric film such as a nano-crystal or one including many charge traps may be used in place of, or in addition to, the exemplary ONO layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A multi-bit nonvolatile memory device comprising:
   a semiconductor substrate in which a recessed region is defined;
   an insulating layer configured to store data within programming regions therein, the insulating layer covering a sidewall and a lower surface of the recess region;
   a gate electrode on the insulating layer in the recessed region; and
   at least one pair of impurity regions in the semiconductor substrate, the impurity regions adjoining a side surface of the insulating layer in the recess region and forming a relative angle that is less than 120° therebetween with respect to a center of the gate electrode, wherein multiple different bit values are selectively stored in different programming regions of the insulating layer around the gate electrode by selective application of voltage to different ones of the impurity regions adjoining the programming regions of the insulating layer to be programmed.

2. The device of claim 1, wherein the insulating layer comprises a first ONO layer.

3. The device of claim 1, wherein the relative angle is 90°.

4. The device of claim 1, wherein the recess region has a cylindrical shape.

5. The device of claim 1, wherein the recess region has a polyhedral shape.

6. The device of claim 5, wherein the recess region has a cubic shape.

7. The device of claim 5, wherein corner areas of the cubic shaped recess region adjoin at least one pair of the impurity regions.

8. The device of claim 5, wherein the recess region between the at least one pair of impurity regions has a linear profile.

9. The device of claim 1, wherein the gate electrode protrudes away from an upper surface of the semiconductor substrate.

10. The device of claim 1, wherein an upper surface of the gate electrode is aligned with an adjacent major upper surface of the semiconductor substrate.

11. The device of claim 1, wherein the at least one pair of impurity regions comprise a first pair of impurity regions formed on a same side of the gate electrode with the gate electrode partially disposed therebetween.

12. The device of claim 11, wherein the at least one pair of impurity regions further comprise a second pair of impurity regions on an opposite side of the gate electrode from the first pair of impurity regions.

13. The device of claim 12, wherein each of the four impurity regions of the first and second pairs of impurity regions are part of a different one of four transistors.

14. The device of claim 12, wherein multiple different bit values are selectively stored in different programming regions of the insulating layer around the gate electrode by selective application of voltage to different ones of the four impurity regions of the first and second pairs of impurity regions adjoining the programming regions of the insulating layer to be programmed.

15. The device of claim 12, wherein the insulating layer comprises a dielectric film that comprises nano-crystal material and/or a dielectric film material with a plurality of charge traps.

16. A multi-bit nonvolatile memory device comprising:
a semiconductor substrate in which a plurality of recess regions are defined;
an insulating layer configured to store data within programming regions therein, the insulating layer covering sidewalls and lower surfaces of the plurality of recess regions;
a pair of gate electrode arrays each comprising gate electrodes on the insulating layer in the plurality of recess regions, wherein the gate electrodes of a first one of the pairs of gate electrode arrays are arranged along a first line and the gate electrodes of a second one of the pairs of gate electrode arrays are arranged along a second line that is parallel to the first line;
a plurality of impurity regions in the semiconductor substrate, the impurity regions arranged in the same direction as the gate electrodes of the pair of gate electrode arrays and adjoin side surfaces of the insulating layer in the recess regions; and
a pair of word lines, one of the pairs of word lines is electrically connected to gate electrodes of the first one of the pairs of gate electrode arrays and is not electrically connected to gate electrodes of the second one of the pairs of gate electrode arrays, and the other one of the pairs of word lines is electrically connected to gate electrodes of the second one of the pairs of gate electrode arrays and is not electrically connected to gate electrodes of the first one of the pairs of gate electrode arrays,
wherein the gate electrodes of the first one of the pairs of gate electrode arrays are spaced apart from the gate electrodes of the second one of the pairs of gate electrode arrays by a predetermined distance, and
wherein multiple different bit values are selectively stored in different programming regions of the insulating layer around each of the gate electrodes by selective application of voltage to different ones of the impurity regions adjoining the programming regions of the insulating layer to be programmed.

17. The device of claim 16, wherein the insulating layer comprises an ONO layer.

18. The device of claim 17, wherein multiple different bit values are selectively stored in different programming regions of the ONO layer around each of the gate electrodes by selective application of voltage to different ones of the impurity regions adjoining the programming regions of the insulating layer to be programmed.

19. The device of claim 16, wherein the plurality of impurity regions each adjoin opposite facing sides of a pair of gate electrodes and are each configured to store charge in a localized region of the adjoining one of the facing sides of the insulating layers on one of the gate electrodes, wherein one of the gate electrodes is in the first one of the pairs of gate electrode arrays and the other one of the gate electrodes is in the second one of the pairs of gate electrode arrays.

20. The device of claim 16, wherein the plurality of impurity regions comprise:
first impurity regions arranged in the same direction as a first one of the pairs of gate electrode arrays and adjoin a same side of gate electrodes of the first one of the pairs of gate electrode arrays, wherein two of the first impurity regions are configured to store charge in different first and second localized regions of the adjoining insulating layer on a first side of a first one of the gate electrodes;
second impurity regions spaced apart from the first impurity regions by a predetermined distance, and arranged in the same direction as the gate electrodes of the first one of the gate electrode arrays, and adjoin an opposite side of the gate electrodes of the first gate electrode arrays from the first impurity regions, wherein the second impurity regions are configured to store charge in different third and fourth localized regions of the adjoining insulating layer on a second side, which is opposite facing to the first side, of the first one of the gate electrodes; and
a pair of bit lines, one of the bit lines is electrically connected to gate electrodes of the first one of the pairs of gate electrode arrays and is not electrically connected to gate electrodes of the second one of the pairs of gate electrode arrays, and the other one of the bit lines is electrically connected to gate electrodes of the second one of the pairs of gate electrode arrays and is not electrically connected to gate electrodes of the first one of the pairs of gate electrode arrays.

* * * * *